US010388607B2

(12) United States Patent
Gong et al.

(10) Patent No.: US 10,388,607 B2
(45) Date of Patent: Aug. 20, 2019

(54) MICROELECTRONIC DEVICES WITH MULTI-LAYER PACKAGE SURFACE CONDUCTORS AND METHODS OF THEIR FABRICATION

(71) Applicant: FREESCALE SEMICONDUCTOR, INC., Austin, TX (US)

(72) Inventors: Zhiwei Gong, Chandler, AZ (US); Scott M. Hayes, Chandler, AZ (US); Michael B. Vincent, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/573,519

(22) Filed: Dec. 17, 2014

(65) Prior Publication Data

US 2016/0181202 A1 Jun. 23, 2016

(51) Int. Cl.
*H01L 23/498* (2006.01)
*H01L 23/538* (2006.01)
(Continued)

(52) U.S. Cl.
CPC ........ *H01L 23/5389* (2013.01); *H01L 21/288* (2013.01); *H01L 21/2855* (2013.01);
(Continued)

(58) Field of Classification Search
CPC ............... H01L 21/762; H01L 21/8229; H01L 21/3063; H01L 21/78; H01L 21/2855; H01L 21/288; H01L 23/5389; H01L 23/53209; H01L 23/3107; H01L 23/5328; H01L 25/0657; H01L 25/50; H01L 21/065; H01L 21/0657; H01L 23/49805; H01L 25/043; H01L 25/0756
(Continued)

(56) References Cited

U.S. PATENT DOCUMENTS 4,866,501 A 9/1989 Shanefield
5,019,946 A 5/1991 Eichelberger et al.
(Continued)

OTHER PUBLICATIONS

Rabaey, J. et al., "Digital Integrated Circuits", Jan. 2003, Pearson Education, 2nd Ed. 38-40.
(Continued)

*Primary Examiner* — Phat X Cao
(74) *Attorney, Agent, or Firm* — Sherry Schumm

(57) ABSTRACT

An embodiment of a device includes a package body having a first sidewall, a top surface, and a bottom surface, and multiple pads that are exposed at the first sidewall and that are electrically coupled to one or more electrical components embedded within the package body. The device also includes a package surface conductor coupled to the first sidewall. The package surface conductor extends between and electrically couples the multiple pads, and the package surface conductor is formed from a first surface layer and a second surface layer formed on the first surface layer. The first surface layer directly contacts the multiple pads and the first sidewall and is formed from one or more electrically conductive first materials, and the second surface layer is formed from one or more second materials that are significantly more resistive to materials that can be used to remove the first materials.

4 Claims, 7 Drawing Sheets

(51) Int. Cl.

| | |
|---|---|
| ***H01L 23/532*** | (2006.01) |
| ***H01L 25/00*** | (2006.01) |
| ***H01L 25/065*** | (2006.01) |
| ***H01L 23/31*** | (2006.01) |
| ***H01L 21/48*** | (2006.01) |
| ***H01L 21/78*** | (2006.01) |
| ***H01L 21/285*** | (2006.01) |
| ***H01L 21/288*** | (2006.01) |
| ***H01L 21/311*** | (2006.01) |
| ***H01L 23/00*** | (2006.01) |
| ***H01L 23/13*** | (2006.01) |

(52) U.S. Cl.
CPC .... *H01L 21/31111* (2013.01); *H01L 21/4846* (2013.01); *H01L 21/78* (2013.01); *H01L 23/13* (2013.01); *H01L 23/3107* (2013.01); *H01L 23/49805* (2013.01); *H01L 23/5328* (2013.01); *H01L 23/5386* (2013.01); *H01L 23/53209* (2013.01); *H01L 23/53214* (2013.01); *H01L 23/53228* (2013.01); *H01L 23/53242* (2013.01); *H01L 23/53257* (2013.01); *H01L 24/96* (2013.01); *H01L 25/0657* (2013.01); *H01L 25/50* (2013.01); *H01L 23/3128* (2013.01); *H01L 2224/04105* (2013.01); *H01L 2224/12105* (2013.01); *H01L 2224/18* (2013.01); *H01L 2225/06551* (2013.01); *H01L 2225/06555* (2013.01); *H01L 2924/0002* (2013.01); *H01L 2924/3512* (2013.01)

(58) Field of Classification Search
USPC ......... 257/53, 396, 632, 635, 678, 686, 736, 257/715, E21.005, E21.006, E21.007, 257/E21.077, E21.17, E21.237, E21.305, 257/E21.324
See application file for complete search history.

(56) References Cited

U.S. PATENT DOCUMENTS

| | | | | |
|---|---|---|---|---|
| 5,279,991 | A | 1/1994 | Minahan et al. | |
| 5,432,729 | A | 7/1995 | Carson et al. | |
| 5,465,186 | A | 11/1995 | Bajorek et al. | |
| 5,675,180 | A | 10/1997 | Pederson et al. | |
| 5,847,448 | A | 12/1998 | Val et al. | |
| 5,977,640 | A | 11/1999 | Bertin et al. | |
| 6,467,880 | B2 | 10/2002 | Rhodes | |
| 6,560,109 | B2 | 5/2003 | Yamaguchi et al. | |
| 6,607,941 | B2 | 8/2003 | Prabhu et al. | |
| 6,674,159 | B1 | 1/2004 | Peterson | |
| 6,818,977 | B2 | 11/2004 | Poo et al. | |
| 6,822,191 | B2 | 11/2004 | De Steur et al. | |
| 6,855,572 | B2 | 2/2005 | Jeung et al. | |
| 7,394,152 | B2 | 7/2008 | Yu et al. | |
| 7,560,215 | B2 | 7/2009 | Sharma et al. | |
| 7,605,457 | B2 | 10/2009 | Hoshino et al. | |
| 7,723,159 | B2 | 5/2010 | Do et al. | |
| 7,732,907 | B2 | 6/2010 | Han et al. | |
| 7,741,156 | B2 * | 6/2010 | Pagaila | H01L 21/6835 257/620 |
| 7,759,800 | B2 | 7/2010 | Rigg et al. | |
| 7,829,998 | B2 | 11/2010 | Do et al. | |
| 7,838,979 | B2 | 11/2010 | Oh | |
| 7,843,046 | B2 | 11/2010 | Andrews et al. | |
| 7,951,649 | B2 | 5/2011 | Val | |
| 7,972,650 | B1 | 7/2011 | Church et al. | |
| 7,994,621 | B2 | 8/2011 | Kim | |
| 8,012,802 | B2 | 9/2011 | Sasaki et al. | |
| 8,030,179 | B2 | 10/2011 | Hoshino et al. | |
| 8,134,229 | B2 | 3/2012 | Sasaki et al. | |
| 8,247,268 | B2 | 8/2012 | Do et al. | |
| 8,362,621 | B2 | 1/2013 | Lee et al. | |
| 8,796,561 | B1 | 8/2014 | Scanlan et al. | |
| 9,025,340 | B2 * | 5/2015 | Wright | H01L 24/19 361/752 |
| 9,036,363 | B2 * | 5/2015 | Vincent | H01L 23/3114 361/752 |
| 9,093,457 | B2 * | 7/2015 | Gong et al. | H01L 23/5389 |
| 9,099,479 | B2 * | 8/2015 | Oganesian | H01L 23/5389 |
| 9,190,390 | B2 * | 11/2015 | Gong | H01L 25/065 |
| 9,263,420 | B2 * | 2/2016 | Vincent | H01L 25/0657 |
| 9,299,670 | B2 * | 3/2016 | Yap | H01L 24/05 |
| 9,305,911 | B2 * | 4/2016 | Vincent | H01L 25/50 |
| 2002/0121702 | A1 | 9/2002 | Higgins, III | |
| 2003/0138610 | A1 | 7/2003 | Tao | |
| 2006/0043569 | A1 | 3/2006 | Benson et al. | |
| 2008/0274603 | A1 | 11/2008 | Do et al. | |
| 2009/0039528 | A1 | 2/2009 | Haba et al. | |
| 2009/0102067 | A1 | 4/2009 | Wyland | |
| 2009/0134527 | A1 | 5/2009 | Chang | |
| 2009/0160065 | A1 | 6/2009 | Haba et al. | |
| 2009/0230533 | A1 | 9/2009 | Hoshino et al. | |
| 2010/0001407 | A1 | 1/2010 | Krause et al. | |
| 2010/0140811 | A1 | 6/2010 | Leal et al. | |
| 2010/0270668 | A1 | 10/2010 | Marcoux | |
| 2010/0320584 | A1 | 12/2010 | Takano | |
| 2011/0012246 | A1 | 1/2011 | Andrews, Jr. et al. | |
| 2011/0037159 | A1 * | 2/2011 | McElrea | H01L 24/24 257/686 |
| 2011/0115091 | A1 | 5/2011 | Watanabe | |
| 2011/0304011 | A1 | 12/2011 | Lee | |
| 2012/0119385 | A1 | 5/2012 | Co et al. | |
| 2012/0187577 | A1 | 7/2012 | Cordes et al. | |
| 2012/0193785 | A1 | 8/2012 | Lin et al. | |
| 2012/0313209 | A1 | 12/2012 | Oganesian | |
| 2013/0010441 | A1 | 1/2013 | Oganesian et al. | |
| 2013/0049225 | A1 | 2/2013 | Kang et al. | |
| 2014/0054783 | A1 | 2/2014 | Gong et al. | |
| 2014/0054796 | A1 * | 2/2014 | Gong | H01L 25/0657 257/777 |
| 2014/0054797 | A1 | 2/2014 | Gong et al. | |
| 2014/0264948 | A1 | 9/2014 | Chou et al. | |

OTHER PUBLICATIONS

Restriction Requirement mailed Apr. 11, 2014 for U.S. Appl. No. 13/591,924, 9 pages.
Non-Final Office Action mailed Jul. 24, 2014 for U.S. Appl. No. 13/591,924, 16 pages (892).
Final Office Action mailed Nov. 19, 2014 for U.S. Appl. No. 13/591,924, 21 pages.
Non-Final Office Action mailed Sep. 13, 2013 for U.S. Appl. No. 13/591,969, 18 pages.
Final Office Action mailed Feb. 14, 2014 for U.S. Appl. No. 13/591,969 16 pages.
Final Office Action mailed Sep. 22, 2014 for U.S. Appl. No. 13/591,969 17 pages.
Notice of Allowance mailed Jan. 28, 2015 for U.S. Appl. No. 13/591,969 7 pages.
Restriction Requirement mailed Mar. 29, 2013 for U.S. Appl. No. 13/591,990, 4 pages.
Non-Final Office Action mailed Jul. 5, 2013 for U.S. Appl. No. 13/591,990, 6 pages.
Final Office Action mailed Dec. 19, 2013 for U.S. Appl. No. 13/591,990, 6 pages.
Notice of Allowance mailed Jan. 8, 2015 for U.S. Appl. No. 13/591,990, 6 pages.
Final Office Action mailed Dec. 5, 2014 for U.S. Appl. No. 13/829,737, 10 pages.
Restriction Requirement mailed Jan. 29, 2015 for U.S. Appl. No. 14/097,424, 8 pgs.
Non-Final Office Action mailed Nov. 18, 2014 for U.S. Appl. No. 13/906,621, 5 pages.
Restriction Requirement mailed May 23, 2014 for U.S. Appl. No. 13/829,737, 9 pages.
First Action Pre-Interview Communication mailed Aug. 14, 2014 for U.S. Appl. No. 13/829,737, 5 pages.

(56) References Cited

OTHER PUBLICATIONS

U.S. Appl. No. 14/042,628, filed Sep. 30, 2013, entitled "Devices and Stacked Microelectronic Packages with In-Trench Package Surface Conductors and Methods of Their Fabrication".
U.S. Appl. No. 14/097,424, filed Dec. 5, 2013, entitled "Devices and Stacked Microelectronic Packages with Package Surface Conductors and Methods of Their Fabrication".
U.S. Appl. No. 14/097,459, filed Dec. 5, 2013, entitled "Devices and Stacked Microelectronic Packages with Package Surface Conductors and Adjacent Trenches and Methods of Their Fabrication".
U.S. Appl. No. 13/906,621, filed May 31, 2013, entitled "Stacked Microelectronic Packages Having Sidewall Conductors and Methods for the Fabrication Thereof".
U.S. Appl. No. 13/591,990, filed Aug. 22, 2012, entitled "Stacked Microelectronic Packages Having Sidewall Conductors and Methods for the Fabrication Thereof".
U.S. Appl. No. 13/829,737, filed Mar. 14, 2013, entitled "Stacked Microelectronic Packages Having Sidewall Conductors and Methods for the Fabrication Thereof".
U.S. Appl. No. 14/042,623, filed Sep. 30, 2013, entitled "Devices and Stacked Microelectronic Packages with Parallel Conductors and Intra-Conductor Isolator Structures and Method of their Fabrication".
U.S. Appl. No. 13/591,924, filed Aug. 22, 2012, entitled "Stacked Microelectronic Packages Having Sidewall Conductors and Mehtods for the Fabrication Thereof".
U.S. Appl. No. 13/591,969, filed Aug. 22, 2012, entitled "Stacked Microelectronic Packages Having Patterned Sidewall Conductors and Methods for the Fabrication Thereof".
Notice of Allowance mailed Feb. 3, 2015 for U.S. Appl. No. 14/042,628, 12 pages.
Non-Final Office Action mailed Feb. 12, 2015 for U.S. Appl. No. 14/097,459, 16 pages.
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Non-Final Office Action mailed Mar. 6, 2015 for U.S. Appl. No. 13/829,737, 11 pages.
Notice of Allowance mailed Apr. 2, 2015 for U.S. Appl. No. 13/591,969, 8 pages.
Final Office Action mailed May 12, 2015 for U.S. Appl. No. 13/906,621, 11 pages.
Notice of Allowance mailed May 19, 2015 for U.S. Appl. No. 13/591,924, 8 pages.
Non-Final Office Action mailed May 22, 2015 for U.S. Appl. No. 14/097,424, 13 pages.
Final Office Action mailed Aug. 11, 2015 for U.S. Appl. No. 13/829,737, 11 pages.
Non-Final Office Action mailed Jul. 31, 2015 for U.S. Appl. No. 14/706,359, 7 pages.
Non-Final Office Action mailed Sep. 3, 2015 for U.S. Appl. No. 13/906,621, 14 pages.
Final Office Action mailed Sep. 4, 2015 for U.S. Appl. No. 14/097,459, 10 pages.
Notice of Allowance mailed Oct. 8, 2015 for U.S. Appl. No. 14/097,424, 9 pages.
Notice of Allowance, dated Sep. 14, 2016 for U.S. Appl. No. 14/994,967, 20 pages.
Notice of Allowance dated Nov. 13, 2015 for U.S. Appl. No. 14/706,359, 5 pages.
Notice of Allowance dated Jan. 29, 2016 for U.S. Appl. No. 13/829,737, 11 pages.
Notice of Allowance dated Dec. 3, 2015 for U.S. Appl. No. 14/097,459, 9 pages.
Notice of Allowance dated Jun. 1, 2016 for U.S. Appl. 14/994,967, 8 pages.
Notice of Allowance dated Nov. 4, 2016 for U.S. Appl. 13/906,621, 7 pages.
Notice of Allowance dated Mar. 21, 2018 for U.S. Appl. No. 14/994,967, 5 pages.

* cited by examiner

MICROELECTRONIC DEVICES WITH MULTI-LAYER PACKAGE SURFACE CONDUCTORS AND METHODS OF THEIR FABRICATION

TECHNICAL FIELD

Embodiments of the present disclosure relate generally to microelectronic packaging and, more particularly, to microelectronic devices and packages having surface conductors and methods for the fabrication thereof.

BACKGROUND

It is often useful to combine multiple microelectronic devices, such as semiconductor die carrying integrated circuits (ICs), micro-electromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, biomedical devices, and other compact electronic devices. Additionally, such 3D packaging techniques may enhance device performance by reducing interconnection length, and thus signal delay, between the packaged microelectronic devices.

BRIEF DESCRIPTION OF THE DRAWINGS

Embodiments of the present disclosure will hereinafter be described in conjunction with the following figures, wherein like numerals denote like elements, and.

Figure 1:
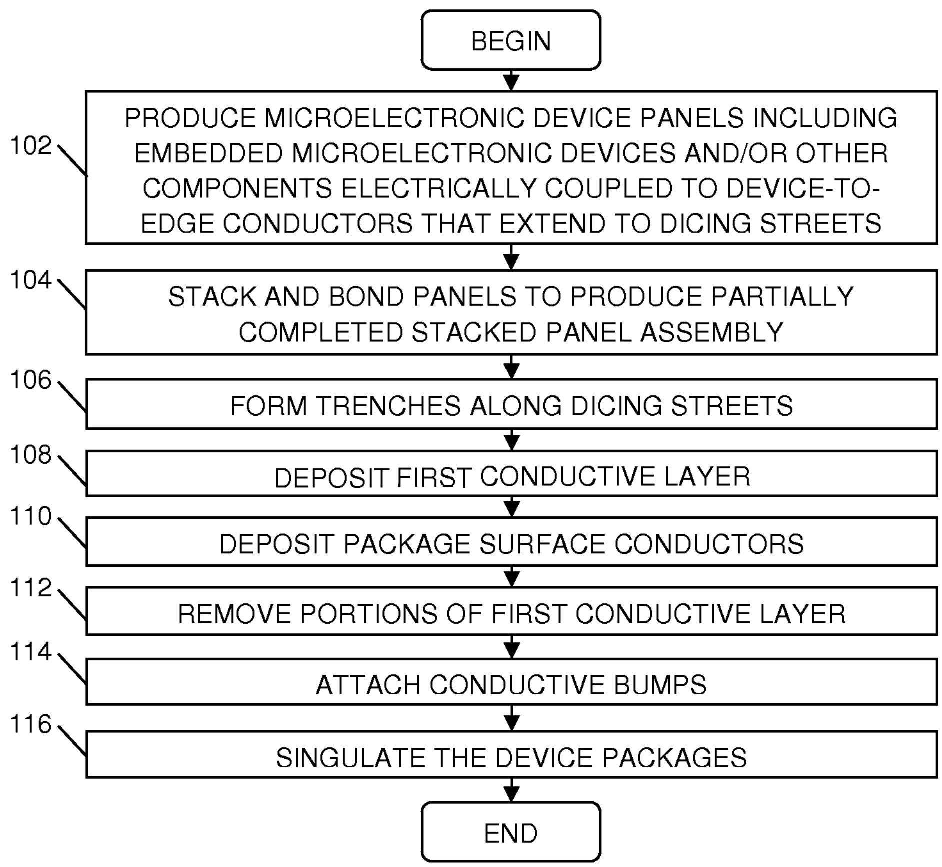
FIG. 1 is a flowchart of a method for fabricating a stacked microelectronic package, according to an embodiment.

For simplicity and clarity of illustration, the drawing figures illustrate the general manner of construction and may omit depiction, descriptions, and details of well-known features and techniques to avoid unnecessarily obscuring the non-limiting embodiments of the disclosure described in the subsequent detailed description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the disclosure.

DETAILED DESCRIPTION

The following detailed description is merely illustrative in nature and is not intended to limit the disclosure or the application and uses of the disclosure. Any implementation described herein as is not necessarily to be construed as preferred or advantageous over other implementations. Furthermore, there is no intention to be bound by any theory presented in the preceding background or the following detailed description.

As used herein, the term "microelectronic device" is utilized in a broad sense to refer to an electronic device, element, or component produced on a relatively small scale and amenable to packaging in the below-described manner. Microelectronic devices include, but are not limited to, integrated circuits (ICs) formed on semiconductor die, micro-electromechanical systems (MEMS), passive electronic components, optical devices, and other small scale electronic devices capable of providing processing, memory, sensing, radio frequency communication, radar, optical functionalities, and actuator functionalities, to list but a few examples.

The term "microelectronic package" denotes a structure containing at least one and typically two or more microelectronic devices, which may or may not be electrically interconnected. A microelectronic package may include, for example, one or more microelectronic devices, packaging material (e.g., encapsulant) substantially surrounding the microelectronic devices, one or more patterned conductive layers and other conductive structures (e.g., vias and the like) that provide electrical connectivity with the microelectronic device(s), and one or more contacts for electrically coupling the microelectronic devices of the microelectronic package with external electrical systems. For example, a microelectronic package may be a "fan out wafer level" (FOWL) package, a ball-grid array (BGA) package, a substrate based wirebond package, a flip chip package, and or another type of package in which microelectronic device(s) are coupled to a device substrate and encapsulated, or in which a device substrate is formed on encapsulated microelectronic device(s). The term "stacked microelectronic package" refers to an assembly containing at least two microelectronic packages stacked together and physically coupled. According to an embodiment, a bottom package in a stacked microelectronic package may include contact pads on its bottom surface (e.g., BGA pads), which enable the stacked microelectronic package to be electrically and physically connected to a printed circuit board (PCB) or other substrate. In addition, in still other embodiments, a top package in a stacked microelectronic package may include contact pads on its top surface, and one or more other devices may be surface mounted to the top surface of the top package.

The term "microelectronic package panel" refers to a structure that includes multiple microelectronic packages in fully or partially completed form and prior to the constituent microelectronic device packages being separated into distinct packages (e.g., prior to a singulation process). The term "stacked microelectronic package panel assembly" refers to a structure that includes multiple microelectronic package panels in a stacked arrangement.

As will be described in more detail below, an embodiment of a microelectronic package includes at least one "device-to-edge conductor," which is a conductive structure that extends between one or more embedded microelectronic devices or other electrical components and a surface of the microelectronic package (e.g., a sidewall, a top surface, a bottom surface, or a surface that ultimately is embedded within the microelectronic package). In some embodiments, some or all conductors within a layer of device-to-edge conductors may not be directly coupled to a microelectronic device in a final assembly, but instead may provide routing to which other layers of device-to-edge conductors are directly coupled. For example, a microelectronic package may include a "device-to-edge conductor" that merely provides routing from one package surface to another package surface (or even between spatially separated points on the same package surface). Although such conductors may not be directly coupled to a microelectronic device, they are still referred to as device-to-edge conductors herein, and that term is intended to include such conductors.

An "exposed end" of a device-to-edge conductor may be referred to herein as a "pad" or a "device-to-edge conductor pad." In some embodiments, prior to singulation of a microelectronic package from a microelectronic package panel, one or more electrical interconnections (referred to herein as "package sidewall conductors" or "package surface conductors") may be formed on one or more package surfaces between device-to-edge conductor pads of a single microelectronic package. In other embodiments, multiple microelectronic package panels (each including multiple microelectronic packages with device-to-edge conductors) may be stacked together to form a stacked microelectronic package panel assembly, and prior to singulation of stacked microelectronic packages from the stacked microelectronic package panel assembly, one or more package surface conductors may be formed between device-to-edge conductor pads of stacked microelectronic packages of the stacked microelectronic package panel assembly.

A device that includes a single microelectronic package or multiple microelectronic packages in a non-stacked or stacked arrangement may be considered to include a "package body," and one or more device-to-edge conductors may extend to the sidewalls and/or other surfaces of the package body. As used herein, the term "package body" means the structural package components of a single microelectronic package or the structural package components of multiple microelectronic packages in a stacked arrangement, where the "structural package components" are those portions of the device that define the shape of the device and hold the electrical components in a fixed orientation with respect to each other.

The following describes embodiments of package surface conductors formed on one or more surfaces of a microelectronic package, microelectronic devices that include such package surface conductors, stacked microelectronic package assemblies, and methods of their formation. As will be apparent from the below description, the package surface conductors can be utilized to provide a convenient manner in which microelectronic devices contained within one or more microelectronic packages can be electrically coupled.

FIG. 1 is a flowchart of an embodiment of a method for fabricating a stacked microelectronic package, according to an embodiment. The completed microelectronic package produced pursuant to the below-described method may also be referred to as a Package-on-Package (PoP) device or a System-in-Package (SiP) device, depending upon the particular manner in which the completed microelectronic package is implemented. Although a result of the performance of the method of FIG. 1 is a microelectronic package that includes multiple, stacked microelectronic packages, it should be understood that embodiments of the inventive subject matter also may be utilized to fabricate a non-stacked or single microelectronic package (i.e., a microelectronic package formed from a single microelectronic package panel, rather than stacked microelectronic package panels).

As shown in FIG. 1 and described in detail below, the method is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of a stacked microelectronic package or certain components included within a stacked microelectronic package are well-known and, in the interests of brevity, will only be mentioned briefly herein or will be omitted entirely without providing the well-known process details. It will be appreciated that method can be utilized to produce various other types of stacked microelectronic packages having configurations that are different from those included in the figures.

Referring to FIG. 1, the method begins with the production of multiple microelectronic package panels in process 102. More particularly, as will be described in detail below, process 102 results in the production of two microelectronic package panels, each of which includes multiple microelectronic packages that include embedded microelectronic devices and/or other components that are electrically coupled to device-to-edge conductors that will, once exposed, extend to one or more package surfaces. Any method suitable for fabricating a stackable package panel having at least one electrically-conductive element exposable through a package sidewall and electrically coupled to microelectronic devices contained within the microelectronic package panel can be carried-out during process 102. Embodiments of the inventive subject matter may be implemented to fabricate various types of microelectronic packages that include device-to-edge conductors that extend to one or more surfaces of the package. Although embodiments illustrated in the figures and discussed below pertain to FOWL types of packages, it is to be understood that the inventive subject matter is not limited to application only in FOWL types of packages.

Figure 2:
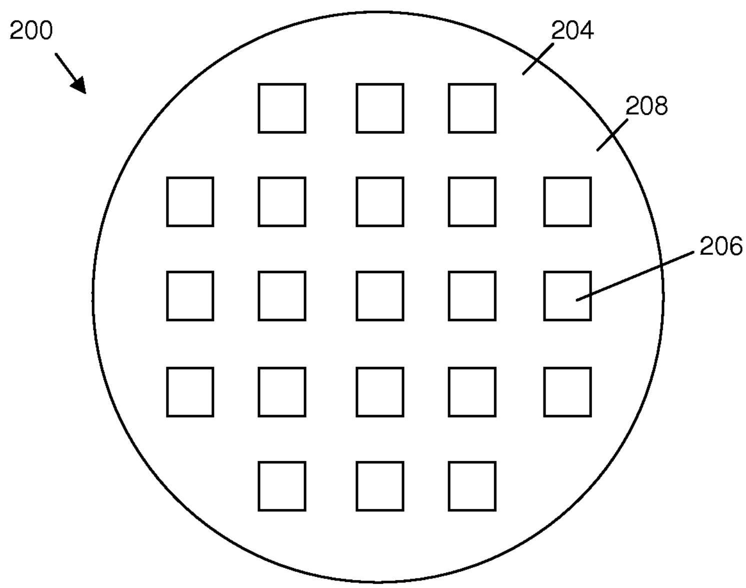
FIG. 2 is a top-down view illustrating a partially-completed microelectronic package panel, according to an embodiment.

FIG. 1 should be viewed in conjunction with FIGS. 2-14, which illustrate various stages in the production of an embodiment of a microelectronic package. More specifically, FIG. 2 is a top-down view illustrating a partially-completed microelectronic package panel 200, which corresponds to a first stage of production of an embodiment of a microelectronic package (e.g., a first stage of production carried out in conjunction with process 102, FIG. 1). According to an embodiment, microelectronic package panel 200 may be produced utilizing an FOWL process or another chips-first packaging technique. More specifically, microelectronic package panel 200 includes a panel body 208 (e.g., formed from encapsulant) in which a plurality of microelectronic devices 206 are embedded. Microelectronic devices 206 may be substantially identical or may instead vary in type, function, size, and so on. For example, some of devices 206 may be devices of a first type (e.g., an application specific integrated circuit (ASIC) die, a microprocessor, or another type of device), while others of devices 206 may be devices of a second type (e.g., a MEMS device or another type of device). According to an embodiment, devices 206 have contact bearing surfaces that are exposed through major surface 204 of panel body 208 (referred to herein as "panel surface 204").

In the illustrated example, device panel 200 includes twenty one square-shaped devices 206 arranged in a grid pattern or array, where each illustrated device 206 is positioned within a package area (i.e., an area corresponding to a single microelectronic package, after a subsequent singulation process). However, the number of microelectronic devices within the panel 200, the number of microelectronic devices within each package area, the planform dimensions of the microelectronic devices (e.g., the die shape and size), and the manner in which the devices are spatially distributed within panel body 208 may vary amongst embodiments. Panel body 208 is typically produced as a relatively thin, disc-shaped body or mass having a generally circular planform geometry. However, panel body 208 can be fabricated to have any desired shape and dimensions. In various embodiments, panel body 208 can have a thickness that is less than, equivalent to, or exceeding the original height of microelectronic devices 206 (or the highest microelectronic device within a package area, when multiple devices are included within the package area).

According to an embodiment, microelectronic package panel 200 may be produced as follows. First, microelectronic devices 206 are positioned in a desired spatial arrangement over the surface of a support substrate or carrier (not shown), with their contact bearing surfaces in contact with the carrier. For example, devices 206 may be arranged over the carrier in a grid array of the type shown in FIG. 2. If desired, one or more release layers may also be applied or formed over the carrier's upper surface prior to positioning of microelectronic devices 206. A mold frame with a central cavity or opening therethrough may be positioned over the carrier and around the array of microelectronic devices 206. An encapsulant, such as a silica-filled epoxy, may then be dispensed into the cavity of the mold frame and allowed to flow over microelectronic devices 206. Sufficient volume of the encapsulant may be dispensed over microelectronic devices 206 to enable the encapsulant to flow over the uppermost or non-contact-bearing surfaces of the microelectronic devices 206. The encapsulant may then be solidified by, for example, an oven cure to yield a solid panel body 208 in which microelectronic devices 206 are embedded. Panel body 208 may be rigid or flexible, depending upon the chosen encapsulant. Panel body 208 may then be released from the carrier to reveal the surface of body 208 through which the contact-bearing surfaces of microelectronic devices 206 are exposed (e.g., panel surface 204 in the embodiment shown in FIG. 2). If desired, the opposed surface of panel body 208 may be ground or polished to bring device panel 200 to a desired thickness prior to release of the panel body 208 from the carrier. The foregoing example notwithstanding, panel body 208 can be produced utilizing various other known fabrication techniques including, for example, compression molding and lamination processes.

After encapsulation of microelectronic devices 206 within panel body 208, a plurality of device-to-edge conductors may be fabricated over panel surface 204 of microelectronic package panel 200. In other embodiments, device-to-edge conductors may be formed entirely or partially at or below the panel surface (e.g., portions of the device-to-edge conductors may be embedded within or at the surface of the encapsulant or package). The term "device-to-edge conductor," as used herein, refers to an electrically-conductive structure or element, such as a metal trace, a wire, an interconnect line, a metal-filled trench, a bond pad, a combination thereof, or the like. Each device-to-edge conductor is electrically coupled to an electrical component that is embedded in a microelectronic package and/or that has at a connection point (to the device-to-edge conductor) that is not co-located with the package surface on which surface conductors are to be formed (e.g., a microelectronic device or other electrical component embedded within a microelectronic package, a bond pad on a bottom surface of the device, and so on). In addition, each device-to-edge conductor will extend to a sidewall or other surface of the package to contact a package surface conductor, such as the sidewall conductors described below in conjunction with FIGS. 11-14. The device-to-edge conductors can assume a wide variety of different forms.

In some embodiments, a device-to-edge conductor may consist of or include a combination of one or more electrically-conductive lines (e.g., metal traces), vias, metal plugs, leadframes, and/or other conductive features, which are formed on, between, and/or through one or more dielectric layers. The conductive lines may be included within one or more layers that may be referred to as "build-up layers," "metal layers," or "redistribution layers" (RDLs). Collectively, the conductive features provide an electrically conductive path between an encapsulated microelectronic device 206 and a package surface conductor to be formed later on the package sidewall, as described below.

Figure 3:
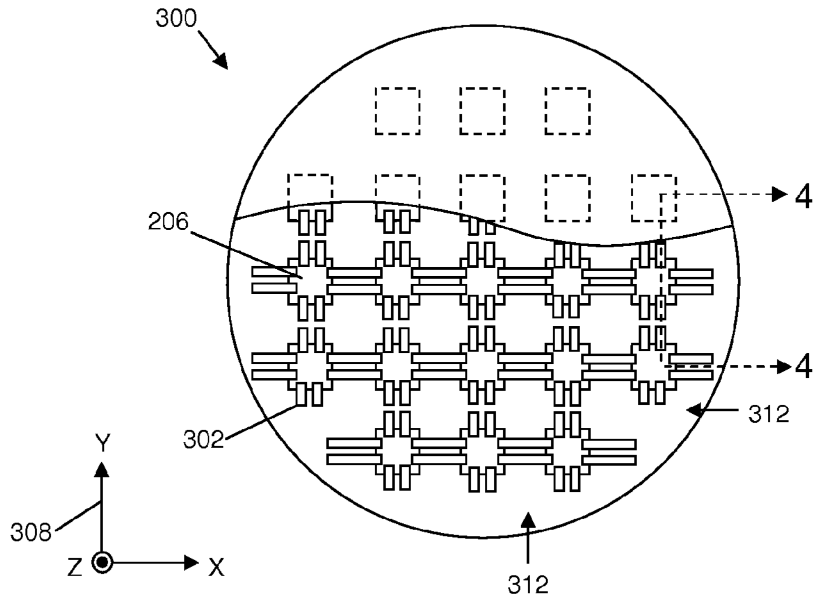
FIG. 3 illustrates a top-down view illustrating the partially-completed microelectronic package panel of FIG. 2 at a later stage of production, according to an embodiment.
Figure 4:
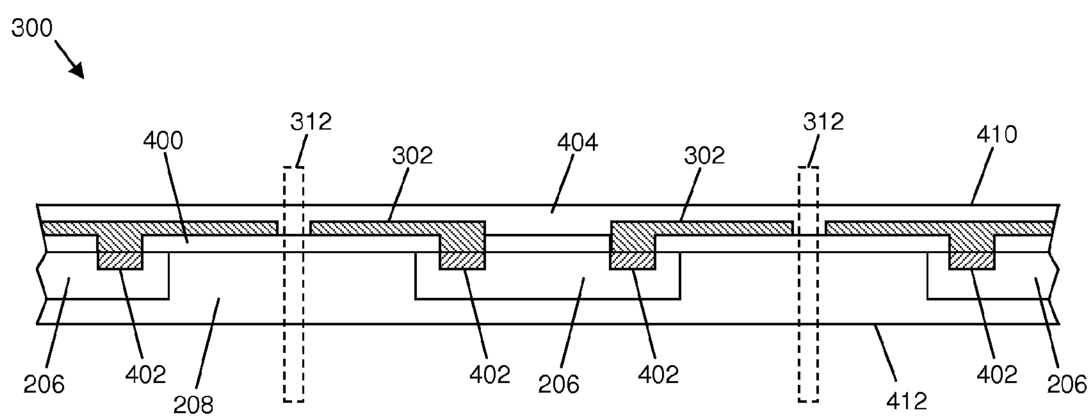
FIG. 4 is a cross-sectional view of a portion of the microelectronic package panel of FIG. 3, according to an embodiment.

FIG. 3 illustrates a top-down view of a partially-completed microelectronic package panel 300 at a later stage of production of an embodiment of a microelectronic package (e.g., a next stage of production carried out in conjunction with process 102, FIG. 1), and FIG. 4 is a cross-sectional side view of a portion of the microelectronic package panel 300 of FIG. 3 along line 4-4, according to an embodiment. In FIG. 3, microelectronic package panel 300 represents a partially cut-away version of device panel 200 after one or more build-up layers (including device-to-edge conductors 302) have been formed over device surface 204 (FIG. 2). The cut-away portion of FIG. 3 shows a number of device-to-edge conductors 302 that can be included in one or more build-up layers over device surface 204 during production of microelectronic package panel 300. As shown in FIGS. 3 and 4, device-to-edge conductors 302 may include a number of interconnect lines or metal (e.g., copper) traces. The trace portions of the device-to-edge conductors 302 may extend along a plane parallel with panel surface 204 or, stated differently, along the x-y plane identified in FIG. 3 by coordinate legend 308. Device-to-edge conductors 302 can be produced using bumping or wafer level packaging fabrication techniques such as sputtering, plating, jetting, photolithography, and/or stencil printing (e.g., of an electrically-conductive ink), to list but a few examples. Device-to-edge conductors 302 may be formed on or between one or more layers of dielectric material, such as layer 400, for example.

As may be appreciated most readily with reference to FIG. 4, device-to-edge conductors 302 are electrically coupled to a number of landing pads or other electrical contact points 402 provided on each microelectronic device 206. Device-to-edge conductors 302 may be electrically connected to device contact points 402 by filled vias, plated vias, metal plugs, or the like formed through the dielectric layer 400 or layers underlying the trace portions of device-to-edge conductors 302. After formation of an uppermost layer of device-to-edge conductors 302, one or more overlying dielectric, capping, or passivation layers 404 may be formed over device-to-edge conductors 302 to define a first surface 410 of the panel 300. The dielectric layers 400, 404 may be formed utilizing a spin-on coating process, printing, lamination, or another deposition technique. According to an embodiment, the outermost dielectric layer 404 has a thickness sufficient to ensure that the ends of device-to-edge conductors 302 will not lift and crack the outermost dielectric layer 404 during subsequent processing steps in which the ends of the device-to-edge conductors 302 are exposed (e.g., in block 106, described later). For this reason, the outermost dielectric layer 404 may be referred to herein as a "trace anchoring layer." According to an embodiment, the trace anchoring layer 404 may have a thickness in a range of about 20 microns to about 30 microns, although the trace anchoring layer 404 may be thicker or thinner, as well.

According to an embodiment, device-to-edge conductors 302 extend from their respective microelectronic devices 206 toward, into, or through dicing streets 312 that are designated between adjacent package areas (i.e., the dicing streets 312 surround or border each device 206 to define a package area). Dicing streets 312 represent portions of device panel 300 located between and around devices 206. According to an embodiment, dicing streets 312 do not include electrically-active elements, and the material within the dicing streets 312 later is removed during device-to-edge conductor exposure and singulation (e.g., in blocks 106 and 116, described later) to yield individual microelectronic packages. Dicing streets 312 are also commonly referred to as "saw streets". However, the term "dicing streets" is used herein to emphasize that, while singulation can be accomplished through a mechanical sawing process, other dicing techniques can be employed to separate the microelectronic packages during singulation including, for example, laser cutting and scribing with punching. As shown in the embodiment illustrated in FIGS. 3 and 4, neighboring device-to-edge conductors 302, which extend along aligning axes (e.g., x- and/or y-axes of coordinate system 308), can be formed to connect or meet within dicing streets 312 and thereby form a continuous conductive line extending between neighboring microelectronic devices 206, as is the case for device-to-edge conductors 302 that are aligned in parallel with the x-axis in FIG. 3. However, the portions of device-to-edge conductors 302 extending into dicing streets 312 alternatively may not be continuous between neighboring microelectronic devices 206, as is the case for device-to-edge conductors 302 that are aligned in parallel with the y-axis in FIG. 3.

While a single layer or level of device-to-edge conductors 302 are shown to be included in microelectronic package panel 300 in the example embodiment shown in FIGS. 3 and 4, multiple layers or levels of device-to-edge conductors 302 can be included within a microelectronic package panel, and/or layers of device-to-edge conductors may be present proximate to other surfaces of a microelectronic panel, in other embodiments. For example, the microelectronic package panel 500 shown in FIG. 5 includes two layers of device-to-edge conductors 510, 514 that proximate one surface 530 of the microelectronic package panel 500. In still other embodiments, layers of device-to-edge conductors may be proximate to both top and bottom surfaces of a microelectronic package panel. Although microelectronic package panels 300, 500 depict particular numbers of layers of device-to-edge conductors, those of skill in the art would understand, based on the description herein, that a microelectronic package may have any practical number of layers of device-to-edge conductors proximate top, bottom, and/or other surfaces of the microelectronic package. Furthermore, in embodiments in which one or more of the individual microelectronic packages include multiple embedded microelectronic devices, additional conductors may also be formed at this juncture in the fabrication process in conjunction with the formation of device-to-edge conductors 302, where those additional conductors may serve to interconnect the multiple devices included within a microelectronic package.

Figure 5:
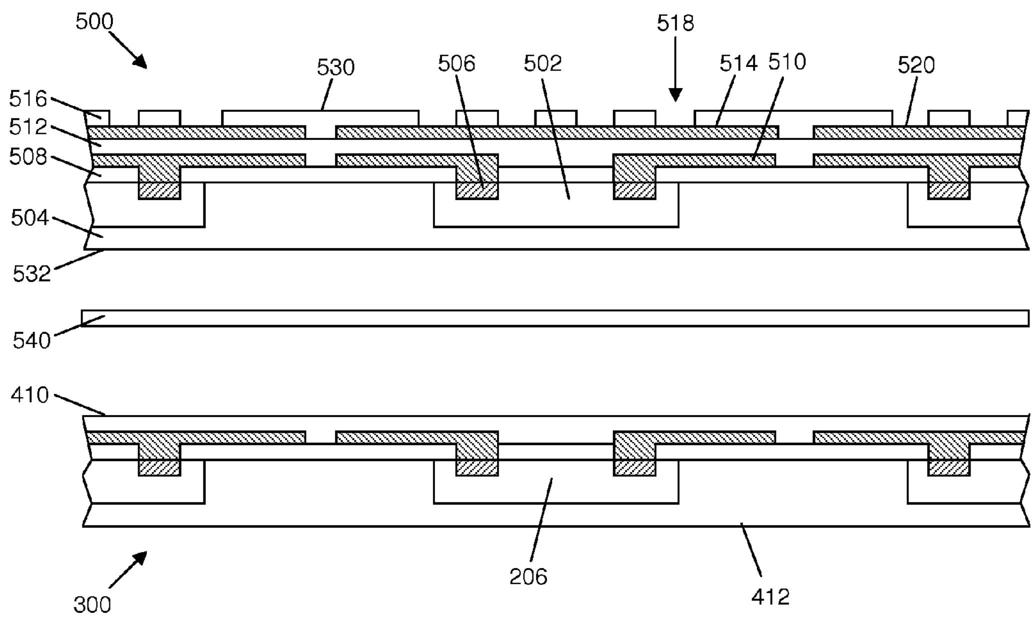
FIGS. 5 and 6 are exploded cross-sectional and cross-sectional views, respectively, depicting a manner which a first microelectronic package panel may be positioned in stacked relationship with a second microelectronic package panel to produce a stacked microelectronic package panel assembly, according to an embodiment.
Figure 6:
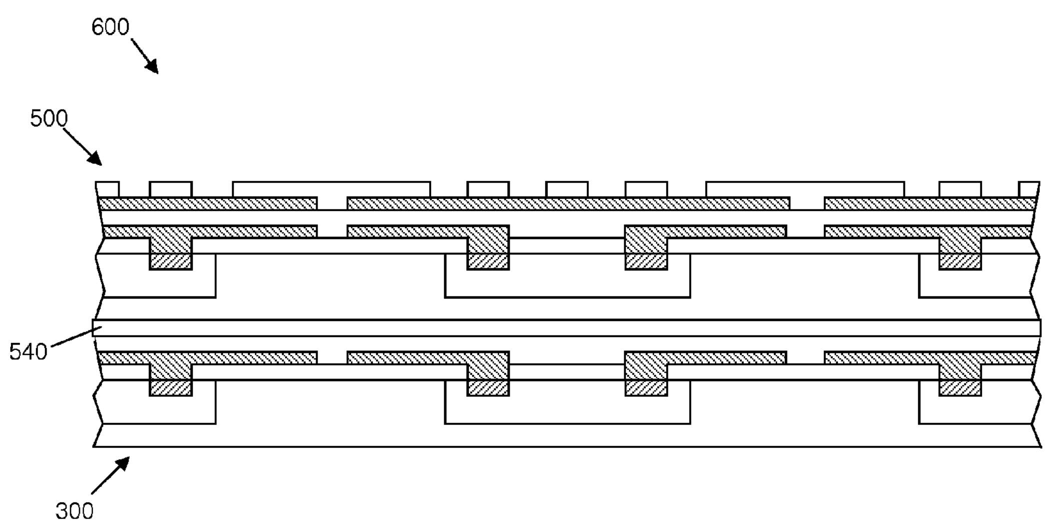

Referring again to FIG. 1 and also to FIGS. 5 and 6, in process 104, a microelectronic package panel (e.g., microelectronic package panel 300 produced during process 102) may be combined with (e.g., stacked and bonded with) one or more additional microelectronic package panels (e.g., microelectronic package panel 500) to produce a partially-completed stacked microelectronic package panel assembly 600. More specifically, FIGS. 5 and 6 include an exploded cross-sectional view and a cross-sectional view, respectively, depicting a manner which a first microelectronic package panel 300 may be positioned in stacked relationship with a second microelectronic package panel 500 to produce a partially-completed stacked microelectronic package panel assembly 600, according to an embodiment. Although assembly 600 includes only two microelectronic package panels 500, 600, any suitable number of additional microelectronic package panels may also be included within a stacked microelectronic package panel assembly.

In view of the illustrated orientation of the stacked microelectronic package panel assembly of FIGS. 5 and 6, microelectronic package panel 300 will be referred to below as "lower microelectronic package panel 300", and microelectronic package panel 500 will be referred to as "upper microelectronic package panel 500." It should be understood, however, that this terminology is used for convenience of reference only, that the orientation of the stacked microelectronic package panel assembly is arbitrary, and that the microelectronic package panel assembly may be inverted during later processing steps.

Microelectronic package panel 500 may be fabricated using techniques similar to those described above with respect to the first microelectronic package panel 300, except that additional processing steps may be carried out to form more than one layer of device-to-edge conductors 510, 514. Microelectronic package panel 500 includes microelectronic devices 502 embedded in encapsulant 504 of the microelectronic package panel 500. In addition, microelectronic package panel 500 includes multiple build-up layers overlying contact surfaces of the microelectronic devices 502. In the illustrated embodiment, the build-up layers include two layers of device-to-edge conductors 510, 514 and three dielectric layers 508, 512, 516 above the contact surfaces of microelectronic devices 502. The innermost layer of device-to-edge conductors 510 may be coupled to electrical contact points 506 of the microelectronic devices 502, and an additional layer of device-to-edge conductors 514 overlies the innermost layer of device-to-edge conductors 510. As with microelectronic package panel 300, outermost dielectric layer 516 (or the "trace anchoring layer" overlying device-to-edge conductors 514) has a thickness that is sufficient to ensure that the ends of device-to-edge conductors 514 will not lift and crack the outermost dielectric layer 516 during device-to-edge conductor exposure (e.g., in block 106, described later). Further, the outermost dielectric layer 516 includes openings 518 that expose contact pads 520 to which electrical connection later may be made.

Microelectronic package panels 300, 500 (and any additional microelectronic device package panels included within the stacked microelectronic package panel assembly) may be laminated or otherwise coupled together during process 104 of method 100. As indicated in FIGS. 5 and 6, this may be accomplished in some cases by applying or otherwise positioning an intervening bonding layer 540 between microelectronic package panels 300, 500 prior to package stacking. Bonding layer 540 can be an epoxy or other adhesive, which may be applied over the upper surface of lower microelectronic package panel 300 and thermally cured after positioning of upper microelectronic package panel 500, for example. This example notwithstanding, any suitable bonding material or means can be utilized to bond microelectronic package panels 300, 500 together including, for example, double-sided adhesive tape, dispensed adhesive, soldering, gluing, brazing, clamping, and so on. By coupling microelectronic package panels 300, 500 together in this manner, the relative positioning of microelectronic package panels 300, 500 and, therefore, the relative positioning of the microelectronic devices 206 and 502 embedded within microelectronic package panels 300, 500 can be maintained during further processing. In any event, the stacked microelectronic package panel assembly 600 may be supported by one or more support substrates (not illustrated) through each of the additional process steps.

As illustrated in FIG. 6, a stacked microelectronic package panel assembly 600 results from the stacking of microelectronic package panels 300, 500. Although the example shown in FIGS. 5 and 6 depict a build-up layer surface 410 of microelectronic package panel 300 bonded to an encapsulant surface 532 of microelectronic package panel 500, an encapsulant surface 412 of microelectronic package panel 300 alternatively may be bonded to the encapsulant surface 532 of microelectronic package panel 500.

Figure 7:
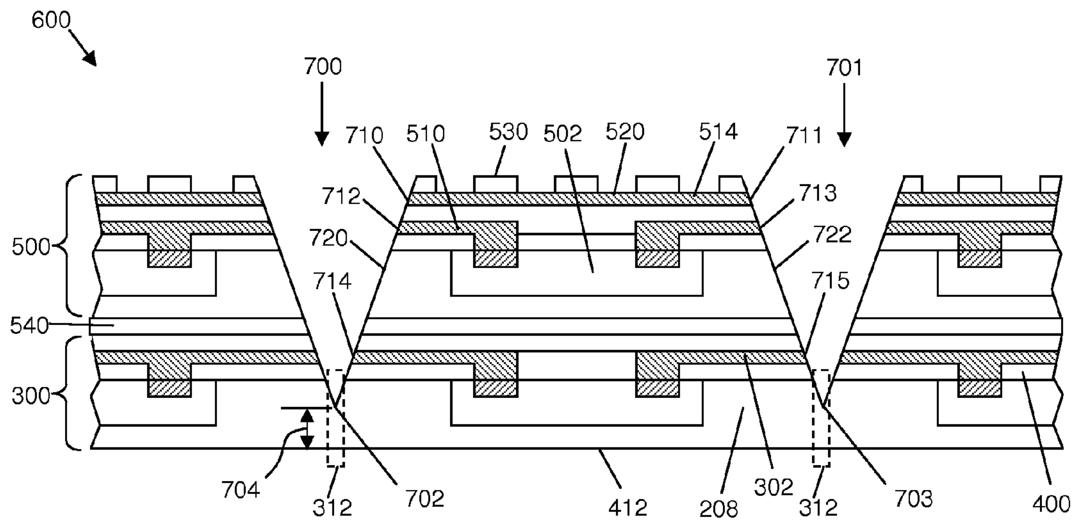
FIGS. 7 and 8 illustrate a cross-sectional side view and top view, respectively, of the stacked microelectronic package panel assembly of FIG. 6 after formation of trenches that expose device-to-edge conductors, according to an embodiment.
Figure 8:
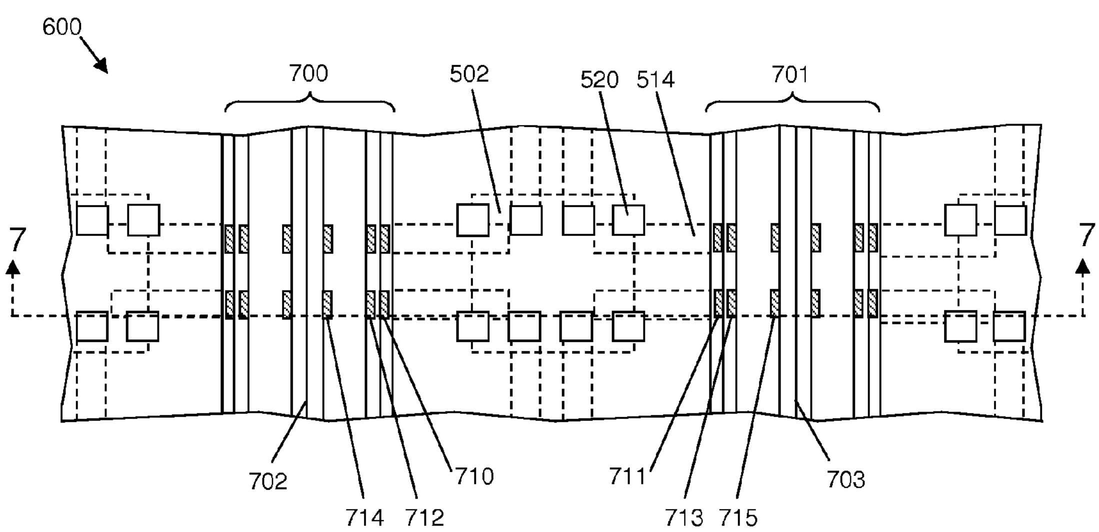

Referring again to FIG. 1 and also to FIGS. 7 and 8, in process 106, trenches 700, 701 are formed in the stacked microelectronic package panel assembly 600, according to an embodiment. More specifically, FIGS. 7 and 8 illustrate a cross-sectional side view and top view, respectively, of the stacked microelectronic package panel assembly 600 after formation of trenches 700, 701. Features hidden under the top surface 530 of microelectronic package panel 500 are indicated with dashed lines in FIG. 8.

Trenches 700, 701 generally intersect dicing streets 312, and are formed so that they also intersect device-to-edge conductors 302, 510, 514 that approach or cross through the dicing streets 312. Accordingly, trenches 700, 701 expose device-to-edge conductor pads 710, 711, 712, 713, 714, 715 at sidewalls 720, 722 of the trenches 700, 701. Trenches 700, 701 may be formed along all or fewer than all of the dicing streets 312, in various embodiments. For example, although FIG. 8 only depicts trenches 700, 701 that extend in a vertical direction with respect to FIG. 8, additional trenches (not shown) also may extend in a horizontal direction that corresponds to additional dicing streets (not shown) that are perpendicular to dicing streets 312. Further, trenches may be formed along some dicing streets, while other dicing streets remain untouched during the trench formation process.

According to an embodiment, trenches 700, 701 extend entirely through upper microelectronic package panel 500 and bonding layer 540, and partially through lower microelectronic package panel 300. The depth of trenches 700, 701 is selected to ensure exposure of all desired device-to-edge conductor pads 710-715. In the illustrated embodiment, the depth of trenches 700, 701 is selected so that the bottoms 702, 703 of trenches 700, 701 are located in panel body 208 (e.g., encapsulant) at a height 704 above the surface 412 of microelectronic package panel 300 that ensures sufficient structural stability of the assembly 600 through additional handling and processing steps. In an alternate embodiment, the bottoms 702, 703 of trenches 700, 701 may be located at or above the surface of the panel body 208 (e.g., in layer 400). In still another alternate embodiment, trenches 700, 701 may extend entirely through microelectronic package panel 300, as well (i.e., formation of trenches 700, 701 essentially is a singulation process).

Trenches 700, 701 may be formed, for example, using a mechanical sawing process that uses a saw blade with a profile that results in a desired shape for trenches 700, 701. As illustrated in FIG. 7, trenches 700, 701 may have a "V-shaped" cross section. In alternate embodiments, trenches 700, 701 may have a "U-shaped" cross section, or a rectangular cross section. The cross-sectional shape of trenches 700, 701 may be defined by the selected trench formation process.

According to an embodiment, the device-to-edge conductor pads 710-715 may be treated in a manner that will increase the quality and robustness of later-formed conductive connections between the device-to-edge conductor pads 710-715. For example, a treatment may be performed to prevent oxidation of the conductive material (e.g., copper) from which the device-to-edge conductors 302, 510, 514 are formed, or more specifically to prevent oxidation of the device-to-edge conductor pads 710-715. In a particular embodiment, a material that inhibits oxidation (referred to herein as an "oxidation inhibiting material") is applied to the device-to-edge conductor pads 710-715. Essentially, the oxidation inhibiting material results in a significantly reduced resistance at the interface between the device-to-edge conductor pads 710-715 and subsequently formed package surface conductors when compared with a resistance that may be present if the oxidation inhibiting treatment were not performed.

For example, the oxidation inhibiting material may include an organic solderability protectant (OSP) coating or another material (e.g., benzotriazole, tolytriazole, benzimidazole, phenylimidazole, or other materials) that adheres to the device-to-edge conductor pads 710-715, and prevents the device-to-edge conductor pads 710-715 from oxidizing. In alternate embodiments, the oxidation inhibiting material may include one or more conductive plating materials (e.g., plating materials that include gold, nickel, silver, tin, palladium, lead, and/or other materials, including but not limited to ENIG (electroless nickel immersion gold), electrolytic gold (NiAu), ENEPIG (electroless nickel electroless palladium immersion gold), HAL/HASL (hot air leveling/hot air solder leveling) Sn/Pb or Pb-free solder, immersion tin, immersion silver, and/or other plating materials) that are applied using an electroplating or electroless plating method. Other materials that inhibit oxidation of the device-to-edge conductor pads 710-715 also could be used, in still other embodiments. Whichever oxidation inhibiting material is selected, the oxidation inhibiting material should be a material that is not electrically insulating and/or that allows sufficient electron tunneling to occur between the device-to-edge conductors 302, 510, 514 and the subsequently formed package surface conductors. In an alternate embodiment, treatment with an oxidation inhibiting material may be excluded from the process.

Figure 9:
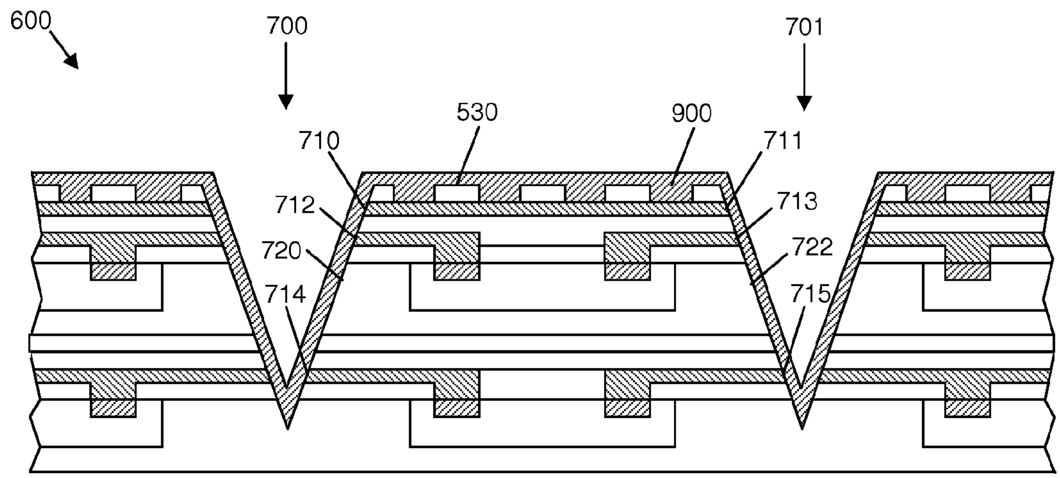
FIG. 9 illustrates a side view of the stacked microelectronic package panel assembly of FIGS. 7 and 8 after deposition of a first surface layer over the stacked microelectronic package panel assembly, according to an embodiment.

After forming trenches 700, 701, and possibly treating the device-to-edge conductor pads 710-715, a multi-step process of forming multi-layer package surface conductors to electrically connect the device-to-edge conductor pads 710-715 is performed. Referring again to FIG. 1 and also to FIG. 9, in process 108, the package surface conductor formation process begins by depositing a first surface layer 900 over the stacked microelectronic package panel assembly 600, according to an embodiment. More specifically, FIG. 9 illustrates a side view of the stacked microelectronic package panel assembly 600 of FIGS. 7 and 8 after deposition of the first surface layer 900. Although reference to "layer 900" is used herein, it should be understood that "layer 900" actually may be comprised of multiple sub-layers. In any event, besides having good electrical conductivity, the first surface layer 900 has characteristics that increase the adhesion of subsequently formed second surface layers (e.g., second surface layers 1002, 1004 formed in block 110), as compared with the adhesion that might otherwise be achieved if the first surface layer 900 were excluded. Accordingly, first surface layer 900 also may be referred to as a "conductive adhesion layer."

According to an embodiment, the first surface layer 900 is formed from one or more conductive materials and/or conductive material layers, which are blanket deposited over an entire top surface 530 of the upper microelectronic device package panel 500 and over an entirety of the sidewalls 720, 722 of trenches 700, 701. Accordingly, in the trenches 700, 701, the first surface layer 900 makes physical and electrical contact with the device-to-edge conductor pads 710-715. In an alternate embodiment, the first surface layer 900 may be selectively deposited at least in the trenches 700, 701, rather than being blanket deposited.

The first surface layer 900 may be formed from any of a number of conductive materials and/or layers of materials, including for example, under bump metallization materials such as titanium (Ti), titanium tungsten (Ti—W), copper (Cu), Ti—Cu, nickel (Ni), titanium nickel (Ti—Ni), chromium (Cr), aluminum (Al), chromium copper (Cr—Cu), gold (Au), silver (Ag), or other suitable conductive materials. For example, the first surface layer 900 may include a first adhesion layer of Ti or Ti—W and a second layer of Cu to function as an oxidation barrier layer. One or more plated metal layers (e.g., Cu, Ag, Au, or other metals) also may be formed as a top layer of the first surface layer 900. Other layer combinations could be used, as well. The first surface layer 900 may be formed, for example, by vacuum deposition (e.g., evaporation or sputtering), chemical plating or by another suitable material deposition process. According to an embodiment, the first surface layer 900 may have a thickness in a range of about 0.2 microns to about 2.0 microns, although the first surface layer 900 may be thinner or thicker, as well.

Figure 10:
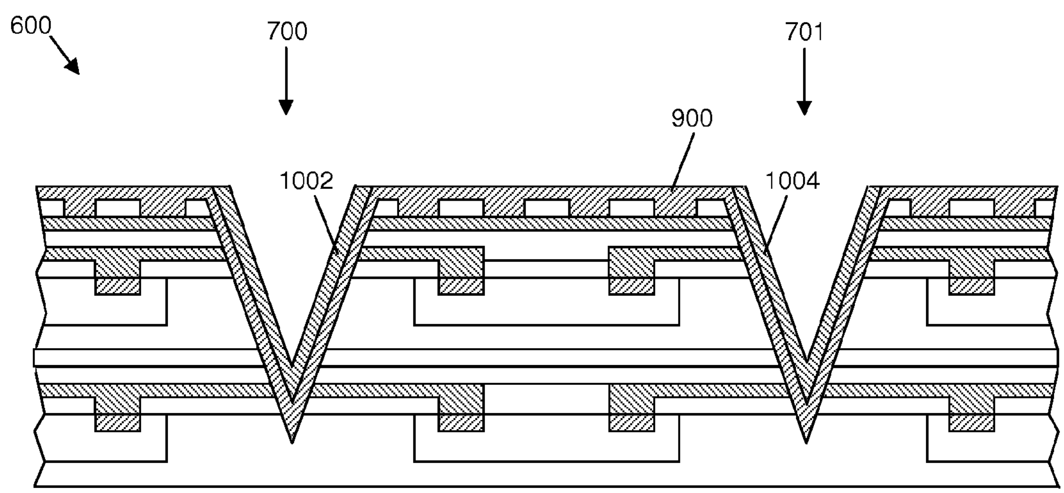
FIG. 10 illustrates a cross-sectional side view of the stacked microelectronic package panel assembly of FIG. 9 after formation of second surface layers over the first surface layer, according to an embodiment.

Referring again to FIG. 1 and also to FIG. 10, in process 110, second surface layers 1002, 1004 are deposited over the first surface layer 900, according to an embodiment. More specifically, FIG. 10 illustrates a cross-sectional side view of the stacked microelectronic package panel assembly 600 of FIG. 9 after formation of the second surface layers 1002, 1004 over the first surface layer 900. Although reference to "layers 1002, 1004" is used herein, it should be understood that each of "layers 1002, 1004" actually may be comprised of multiple sub-layers.

According to an embodiment, the second surface layers 1002, 1004 are formed from one or more conductive materials, which are selectively deposited over portions of the first surface layer 900. In an alternate embodiment, the second surface layers 1002, 1004 may be formed from a non-conductive material. In any event, the material forming the second surface layers 1002, 1004 may have the characteristic that it is significantly more resistive to the material (e.g., etchants such as sulfuric acid, hydrogen peroxide, sodium persulfate, ammonium persulfate, or other etchants) or process that later will be used (i.e., in process 112) to remove portions of the first surface layer 900. Accordingly, second surface layers 1002, 1004 also may be referred to as "masking layers."

As is more clearly depicted in FIG. 12, which will be discussed in more detail later, the second surface layers 1002, 1004 are deposited over portions of the first surface layer 900 that extend between sets of device-to-edge conductor pads 710-715 that are to be electrically connected by the multi-layer package surface conductors. Accordingly, the second surface layers 1002, 1004 are deposited at least within the trenches 700, 701 between sets of device-to-edge conductor pads 710-715 that are to be interconnected. According to an embodiment, the second surface layers 1002, 1004 may have thicknesses in a range of about 2.0 microns to about 20.0 microns, although the second surface layers 1002, 1004 may be thicker or thinner, as well.

The second surface layers 1002, 1004 may be deposited, for example, by coating, spraying, dispensing, evaporating, sputtering, jetting (e.g., inkjet and/or aerosol jet printing), stencil printing, needle dispense, or otherwise depositing the conductive material on the first surface layer 900. For some types of dispensing methods, the material of the second surface layers 1002, 1004 may be dispensed using multiple deposition passes, where each pass may successively increase the height of the material forming the second surface layers 1002, 1004. According to an embodiment, excess material from process 110 that may be present on the first surface layer 900 between what will become the final package surface conductors (e.g., package surface conductors 1101-1104, FIG. 11) may be removed using laser ablation, a selective etching process, or another material removal process.

In embodiments in which the second surface layers 1002, 1004 are formed from a conductive material, the conductive material may include an electrically-conductive adhesive (ECA). In other embodiments, other suitable conductive materials may be used, including but not limited to conductive polymers and conducting polymers (e.g., polymers filled with conductive particles and/or nanoparticles such as metals (e.g., silver, nickel, copper, gold, and so on), alloys of metals, metal coated organic particles, metal coated ceramic particles), solder pastes, solder-filled adhesives, particle- and nanoparticle-filled inks, liquid metals (e.g., gallium indium (GaIn) and other liquid metals), and metal-containing adhesives or epoxies, such as silver-, nickel-, and copper-filled epoxies (collectively referred to herein as "electrically-conductive pastes"). Suitable conductive materials also include low melting point metals and alloys lacking resins or fluxes (e.g., metals and alloys having melting points below 300° C.). Such materials include, but are not limited to, indium and bismuth.

In embodiments in which the second surface layers 1002, 1004 are formed from a non-conductive material, the non-conductive material may include silicone, polyurethane, epoxy, acrylic, or other suitable non-conductive materials.

According to an embodiment, after their deposition, the first and second surface layers 900, 1002, 1004 may be cured. As used herein, the term "cure" means any process that causes deposited material (e.g., first and second surface layers 900, 1002, 1004) to harden into a resilient solid structure, including sintering, exposing the material to chemical additives and/or gasses, and exposing the material to ultraviolet radiation, electron beams, or elevated temperatures. In an alternate embodiment, curing the first and second surface layers 900, 1002, 1004 may be performed later (e.g., after process 112). In any event, whether the curing process is performed in conjunction with process 110 or later, curing may include exposing the microelectronic package panel assembly 600 to a temperature in a range of about 150 degrees Celsius (C) to about 300 degrees C. for a period of time that is sufficient for curing to occur. In other embodiments, curing may include exposing the assembly 600 to a higher or lower temperature.

Figure 11:
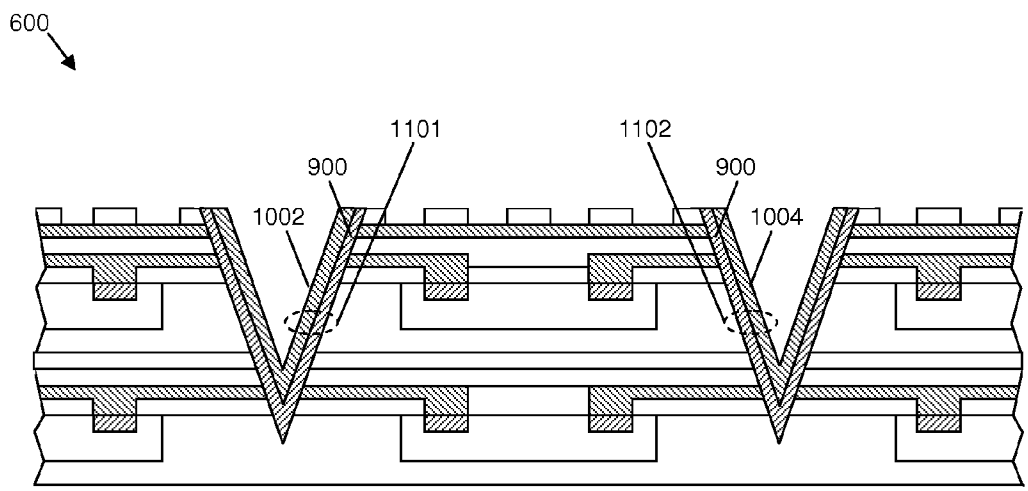
FIGS. 11 and 12 illustrate a cross-sectional side view and top view, respectively, of the stacked microelectronic package panel assembly of FIG. 10 after selective removal of the first surface layer, according to an embodiment.

The above-described process results in the formation of distinct second surface layers 1002, 1004, where each second surface layer 1002, 1004 defines the shape of a final package surface conductor that will electrically couple a set of the device-to-edge conductor pads 710-715. Referring again to FIG. 1 and also to FIGS. 11 and 12, in process 112, portions of the first surface layer 900 that are not covered by the second surface layers 1002, 1004 are selectively removed to complete formation of package surface conductors 1101, 1102, 1103, 1104, according to an embodiment. More specifically, FIGS. 11 and 12 illustrate a cross-sectional side view and top view, respectively, of the stacked microelectronic package panel assembly 600 of FIG. 10 after selective removal of portions of the first surface layer 900. Features hidden under the top surface of microelectronic package panel assembly 600 are indicated with dashed lines in FIG. 12.

Removal of the portions of the first surface layer 900 that are not covered by the second surface layers 1002, 1004 may be performed, for example, by performing an isotropic etching process with a corrosive liquid or chemically active ionized gas that is selective to the material of the first surface layer 900. Alternatively, other material removal processes may be used, such as anisotropic etching, spray etching, and so on. As mentioned previously, the material forming the second surface layers 1002, 1004 may have the characteristic that it is significantly more resistive to the material or process that is used to remove portions of the first surface layer 900. Accordingly, the second surface layers 1002, 1004 may function as a mask to protect portions of the first surface layer 900 that underlie the second surface layers 1002, 1004. In other embodiments, other masking materials (not shown) may be applied prior to process 112 to protect the second surface layers 1002, 1004 and/or other portions of the first surface layer 900 during process 112. For example, other masking materials may be used to protect portions of the first surface layer 900 covering contact pads 520 (e.g., to allow those portions of first surface layer 900 to function as under bump metallization on the contact pads 520). Those other masking materials may be removed after process 112.

In any event, removal of the portions of the first surface layer 900 that do not underlie the second surface layers 1002, 1004 essentially completes formation of the package surface conductors 1101-1104, and thus the formation of distinct electrical connections between sets of device-to-edge conductor pads 710-715. By establishing electrical connections between the device-to-edge conductor pads 710-715, the package surface conductors 1101-1104 also serve to electrically interconnect the microelectronic devices 206, 502 that are coupled with the device-to-edge conductor pads 710-715 through the device-to-edge conductors 302, 510, 514.

As the figures and description clearly convey, each package surface connector 1101-1104 is formed from multiple surface layers (i.e., first surface layer 900 and second surface layers 1002, 1004). Although each multi-layer package surface connector 1101-1104 is indicated to be formed from two surface layers, in alternate embodiments, the package surface connectors 1101-1104 may be formed from more than two surface layers.

In any event, a first package surface connector 1101 electrically connects a first set of device-to-edge conductor pads that includes device-to-edge conductor pads 710, 712, 714, and a second package surface connector 1102 connects a second set of device-to-edge conductor pads that includes device-to-edge conductor pads 711, 713, 715. As can be seen most clearly in FIG. 12, additional package surface connectors 1103, 1104 interconnect other sets of device-to-edge conductor pads.

Figure 12:
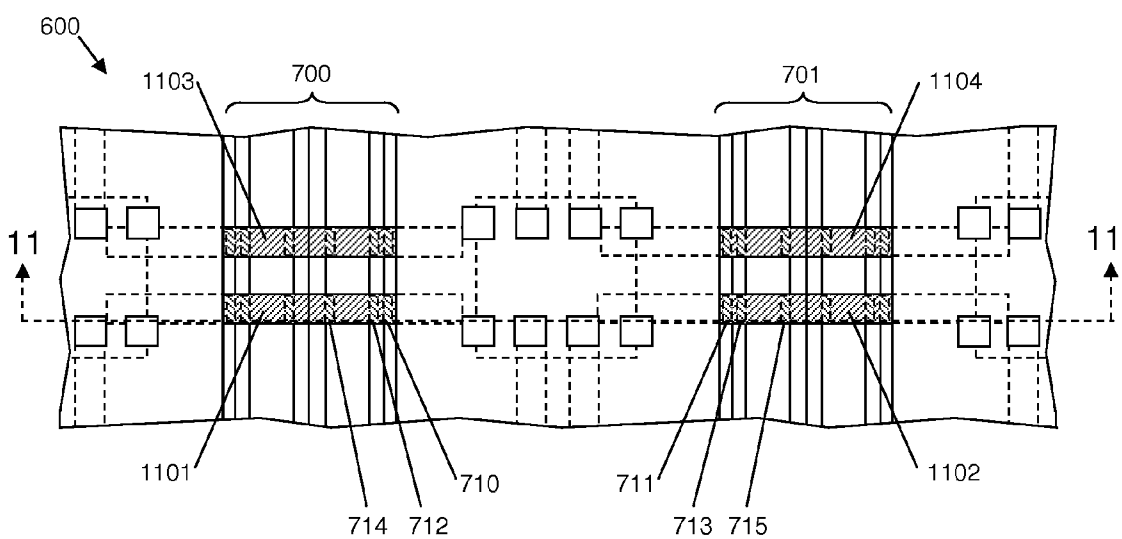

Although FIGS. 11 and 12 depict package surface conductors 1101-1104 that extend in a vertical direction with respect to the assembly top and bottom surfaces (which are considered to be in horizontal planes), package surface conductors may extend in horizontal, diagonal, curved, zigzag or other directions, as well, in other embodiments. Further, embodiments of the inventive subject matter may include devices in which package surface conductors are formed on package surfaces other than trench sidewalls. For example, package surface conductors may be formed on a top surface, a bottom surface, and/or on embedded surfaces (e.g., between package layers) of a microelectronic package. Accordingly, a "package surface," as used herein, may mean a sidewall, a top surface, a bottom surface, or an embedded surface. For ease of illustration and explanation, however, the figures and description depict and describe vertically-oriented package surface conductors that extend between device-to-edge conductor pads of stacked microelectronic package panels (e.g., package panels 300, 500). According to an embodiment, microelectronic package panels 300, 500 are fabricated so that, once they are assembled together to form a microelectronic package panel assembly, pairs of sidewall pads generally align with each other in a vertical direction. However, as package surface conductors may have non-linear shapes and/or non-vertical orientations, the sidewall pads within a pair may not be aligned with each other in a vertical direction, in other embodiments.

In the illustrated embodiments, package surface conductors 1101-1104 electrically couple device-to-edge conductor pads 710-713 of an upper microelectronic package panel 500 with device-to-edge conductor pads 714, 715 of a lower microelectronic package panel 300. Because package surface conductors 1101-1104 electrically couple device-to-edge conductor pads 710-715 of different microelectronic package panels 300, 500, package surface conductors 1101-1104 may be referred to as an "inter-package" package surface conductor. In other embodiments, a package surface conductor may electrically couple a device-to-edge conductor pad on the bottom side of a microelectronic package panel with another device-to-edge conductor pad on the top side of the same microelectronic package panel. Because such a package surface conductor electrically couples device-to-edge conductor pads on the top and bottom of a single microelectronic package panel, such a package surface conductor may be referred to as a "top-side-to-bottom-side" package surface conductor. In still other embodiments, a package surface conductor may electrically couple a device-to-edge conductor pad on one side of a microelectronic package panel with another device-to-edge conductor pad also on the same side of microelectronic package panel. Because such a package surface conductor electrically couples device-to-edge conductors pads on a same side of a single microelectronic package panel, such a package surface conductor may be referred to as an "inter-layer" package surface conductor.

According to an embodiment, after formation of package surface conductors 1101-1104, a conformal protective coating (not shown) may be applied over the package surface conductors 1101-1104. According to various embodiments, the protective coating may be formed from a material that provides mechanical stability and/or a moisture barrier for the package surface conductors 1101-1104. According to a further embodiment, the protective coating may be formed from a material that is electrically insulating. In an alternate embodiment, the protective coating may be formed from a conductive material, as long as the protective coating does not produce undesired electrical shorting between the package surface conductors 1101-1104. Further, the protective coating may function to prevent dendrite growth (e.g., silver dendrite growth, when the package surface conductors 1101-1104 include silver). For example, the protective coating may include one or more materials selected from silicone, urethane, parylene, or other suitable materials. According to an embodiment, the protective coating may have a thickness in a range of about 1.0 microns to about 100 microns, although the protective coating may be thicker or thinner, as well. After applying the protective coating, the protective coating may be cured.

The embodiments of assemblies and methods of their fabrication described above include embodiments in which package surface conductors 1101-1104 are applied directly to the substantially planar surfaces of the microelectronic package panels 300, 500. In other embodiments, cavities, openings, or trenches that extend between device-to-edge conductor pads may first be formed in the package surfaces prior to forming the package surface conductors. In still other embodiments, cavities, openings, or trenches may be formed in the package surfaces between adjacent package surface conductors to decrease the possibility of shorts between the adjacent package surface conductors. In still other alternate embodiments, dielectric structures may be formed between adjacent package surface conductors to decrease the possibility of shorts between the adjacent sidewall conductors.

Figure 13:
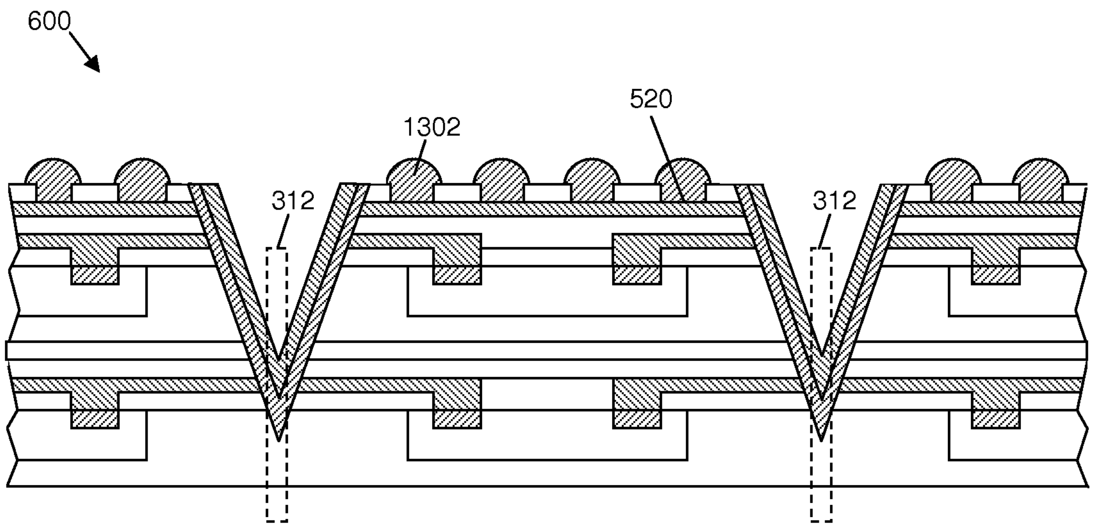
FIG. 13 illustrates a cross-sectional side view of the stacked microelectronic package panel assembly of FIGS. 11 and 12 after formation of conductive bumps on contact pads, according to an embodiment.

Referring again to FIG. 1 and also to FIG. 13, in process 114, conductive bumps 1302 (e.g., solder balls) are attached to contact pads 520, according to an embodiment. More specifically, FIG. 13 illustrates a cross-sectional side view of the stacked microelectronic package panel assembly 600 of FIGS. 11 and 12 after formation of conductive bumps 1302 on contact pads 520. Standard techniques may be used to form conductive bumps 1302.

Figure 14:
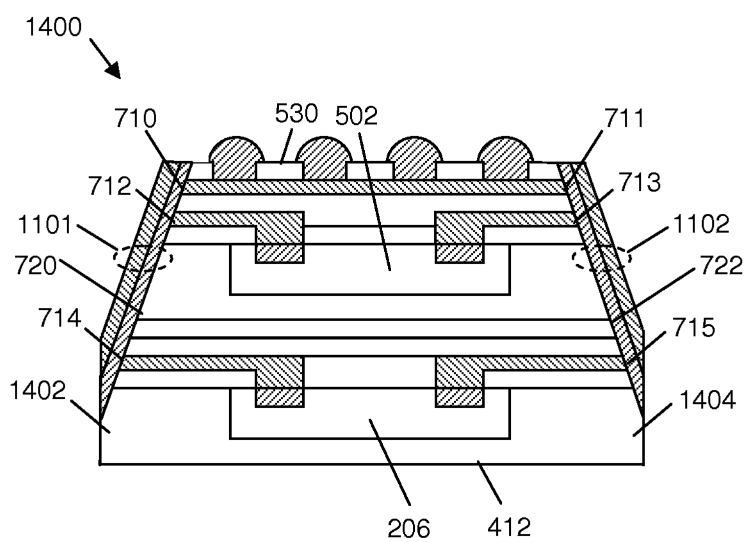
FIG. 14 illustrates a cross-sectional side view of a completed stacked microelectronic package after singulation of the stacked microelectronic package panel assembly of FIG. 13, according to an embodiment.

Referring again to FIG. 1 and also to FIG. 14, in process 116, a singulation process is performed to separate microelectronic package 1400 from the microelectronic package panel assembly 600, according to an embodiment. More specifically, FIG. 14 illustrates a cross-sectional side view of a completed stacked microelectronic package 1400 after singulation of the stacked microelectronic package panel assembly 600 of FIG. 13, according to an embodiment.

Singulation produces a microelectronic package 1400 that includes multiple microelectronic devices 206, 502 embedded in a microelectronic package body, and a plurality of package surface conductors 1101, 1102 that electrically connect sets of device-to-edge conductor pads 710-715. Device singulation can be carried-out by mechanical sawing through dicing streets 312 (FIG. 13), in an embodiment. However, any suitable separation process can be utilized, including laser cutting and scribing with punching. In one embodiment, singulation is performed utilizing a conventional dicing saw, such as a water-cooled diamond saw.

FIG. 14 illustrates, in cross-sectional view, a completed stacked microelectronic package 1400. According to an embodiment, microelectronic package 1400 is cut to have a substantially rectangular shape (when viewed from the top or bottom) and to include four package edges 1402, 1404 that are substantially perpendicular to the package bottom and tom surfaces 412, 530. The package edges 1402, 1404 directly abut the bottom package surface 412, and the previously-discussed trench sidewalls 720, 722 extend at an angle from the package edges 1402, 1404 to the package top surface 530.

The embodiments illustrated herein and discussed in detail above pertain to FOWL packages in which conductive and dielectric layers are built up over an encapsulated panel of devices. Essentially, the build-up layers function as a "substrate" for providing electrical connections to the encapsulated devices. As indicated previously, embodiments of the inventive subject matter may be implemented using other packaging technologies as well. For example, the build-up layers associated with each of the microelectronic package panels 300, 500 discussed previously could be replaced with BGA panels or other types of substrates, in other embodiments. In such an embodiment, the devices would be coupled to the BGA panels or other substrates and subsequently encapsulated. The additional processes of stacking (process 104), forming package surface connections (processes 106-112), attaching conductive bumps (process 114), and singulating the devices (process 116) could thereafter be performed.

An embodiment of a device includes a package body having a first sidewall, a top surface, and a bottom surface, and multiple pads that are exposed at the first sidewall and that are electrically coupled to one or more electrical components embedded within the package body. The device also includes a package surface conductor coupled to the first sidewall. The package surface conductor extends between and electrically couples the multiple pads, and the package surface conductor is formed from a first surface layer and a second surface layer formed on the first surface layer. The first surface layer directly contacts the multiple pads and the first sidewall and is formed from one or more electrically conductive first materials, and the second surface layer is formed from one or more second materials that are significantly more resistive to materials that can be used to remove the first materials.

An embodiment of a method of forming a device includes forming a trench through a top surface of a microelectronic device package panel assembly that includes multiple package areas, where the trench is formed between adjacent ones of the multiple package areas, the trench exposes multiple pads at a trench sidewall, and the multiple pads are electrically coupled to one or more electrical components embedded within the microelectronic device package panel assembly. The method also includes forming a package surface conductor on the trench sidewall. The package surface conductor extends between and electrically couples the multiple pads. Forming the package surface conductor includes depositing a first surface layer on the trench sidewall, depositing a second surface layer on the first surface layer, and removing portions of the first surface layer that do not underlie the second surface layer. The first surface layer directly contacts the multiple pads and is formed from one or more electrically conductive first materials. The second surface layer is formed from one or more second materials.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the disclosure are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical (e.g., mechanical) manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

While at least one embodiment has been presented in the foregoing detailed description, it should be appreciated that a vast number of variations exist. It should also be appreciated that the embodiment or embodiments are only examples, and are not intended to limit the scope, applicability, or configuration of the disclosure in any way. Rather, the foregoing detailed description will provide those skilled in the art with a convenient road map for implementing embodiments of the disclosure. It being understood that various changes may be made in the function and arrangement of elements described in an embodiment without departing from the scope of the disclosure as set-forth in the appended claims.

What is claimed is:

1. A device, comprising:

a package body having a first sidewall, a top surface, and a bottom surface;

multiple pads that are exposed at the first sidewall and that are electrically coupled to one or more electrical components embedded within the package body; and a package surface conductor coupled to the first sidewall, wherein the package surface conductor extends between and electrically couples the multiple pads, wherein the package surface conductor is formed from a first surface layer and a second surface layer formed on the first surface layer, wherein the first surface layer directly contacts the multiple pads and the first sidewall and is formed from one or more electrically conductive first materials, wherein the second surface layer is formed from one or more conformal, electrically conductive second materials that are different from the conductive first materials, wherein the one or more second materials provide an etch mask that is significantly more resistive to etchant materials than the first materials, and wherein the one or more second materials are selected from an electrically conductive adhesive, a conductive polymer, a conducting polymer, a particle-filled ink, a nanoparticle-filled ink, gallium indium (GaIn), a metal-containing adhesive, and a metal-containing epoxy such as silver-, nickel-, and copper-filled epoxy, indium, and bismuth.

2. The device of claim 1, wherein the first surface layer is formed from one or more materials selected from titanium (Ti), titanium tungsten (Ti—W), copper (Cu), Ti—Cu, nickel (Ni), titanium nickel (Ti—Ni), chromium (Cr), aluminum (Al), chromium copper (Cr—Cu), gold (Au), and silver (Ag).

3. The device of claim 1, wherein the multiple pads comprise exposed portions one or more conductive layers of a plurality of build up layers over an encapsulated panel of the one or more electrical components.

4. The device of claim 1, wherein the multiple pads comprise exposed portions of one or more conductive layers of a substrate to which the one or more electrical components are attached.

* * * * *